United States Patent
Whelan et al.

(10) Patent No.: US 11,105,874 B2
(45) Date of Patent: Aug. 31, 2021

(54) MAGNETIC RESONANCE UNIT AND METHOD FOR COMPENSATING FOR BASIC MAGNETIC FIELD INHOMOGENEITIES OF THE FIRST ORDER IN AN EXAMINATION REGION OF THE MAGNETIC RESONANCE UNIT

(71) Applicant: Siemens Healthcare GmbH, Erlangen (DE)

(72) Inventors: Brendan Whelan, Sydney (AU); Heiko Rohdjeß, Grossenseebach (DE); Martino Leghissa, Wiesenthau (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/876,047

(22) Filed: May 16, 2020

(65) Prior Publication Data

US 2020/0363483 A1  Nov. 19, 2020

(30) Foreign Application Priority Data

May 16, 2019  (EP) .................................... 19174823

(51) Int. Cl.
*G01R 33/3875* (2006.01)
*G01R 33/385* (2006.01)

(52) U.S. Cl.
CPC ....... *G01R 33/3875* (2013.01); *G01R 33/385* (2013.01)

(58) Field of Classification Search
CPC .......................... G01R 33/3875; G01R 33/385
See application file for complete search history.

(56) References Cited

U.S. PATENT DOCUMENTS

| 5,650,724 A | 7/1997 | Yamagata |
| 6,507,190 B1 * | 1/2003 | Hinks ................... G01R 33/389 |
| | | 324/307 |
| 2013/0147476 A1 * | 6/2013 | Shvartsman ....... G01R 33/3875 |
| | | 324/309 |
| 2019/0090777 A1 | 3/2019 | Leghissa |

FOREIGN PATENT DOCUMENTS

WO  WO2006088453 A1  8/2006

OTHER PUBLICATIONS

Actively shielded gradients: "Questions and Answers in MRI", http://mriquestions.com/active-shielded-gradients.html, Apr. 9, 2019.
European Office Action for European Application No. 19174823.5—1022 dated Dec. 12, 2019.
Juchem, Christoph, et al. "Magnetic field modeling with a set of individual localized coils." Journal of Magnetic Resonance 204.2 (2010): 281-289.

* cited by examiner

*Primary Examiner* — G. M. A Hyder
(74) *Attorney, Agent, or Firm* — Lempia Summerfield Katz LLC

(57) ABSTRACT

A magnetic resonance unit includes a shim coil apparatus and a gradient coil apparatus. The shim coil apparatus is configured to compensate for basic magnetic field inhomogeneities of the first order in an examination region of the magnetic resonance unit. The shim coil apparatus includes at least one shim coil element. The gradient coil apparatus is arranged in a gradient coil layer. In addition to the gradient coil apparatus, at least one part of the at least one shim coil element is arranged in the gradient coil layer.

16 Claims, 6 Drawing Sheets

MAGNETIC RESONANCE UNIT AND METHOD FOR COMPENSATING FOR BASIC MAGNETIC FIELD INHOMOGENEITIES OF THE FIRST ORDER IN AN EXAMINATION REGION OF THE MAGNETIC RESONANCE UNIT

This application claims the benefit of European Patent Application No. EP 19174823.5, filed on May 16, 2019, which is hereby incorporated by reference in its entirety.

BACKGROUND

The present embodiments relate to a magnetic resonance unit and to a method for compensating for basic magnetic field inhomogeneities.

In a magnetic resonance (MR) examination, an examination subject (e.g., a patient) is often exposed to a relatively strong basic magnetic field of, for example, 1.5, 3, or 7 tesla. This may be facilitated by positioning the examination subject inside a recording region of a magnetic resonance unit. By positioning the examination subject inside the relatively strong basic magnetic field, there may be a parallel or anti-parallel alignment of nuclear spins (e.g., of water proton spins) in the direction of the basic magnetic field inside the examination subject. This leads to a precession of the nuclear spins around the direction of the basic magnetic field with a Larmor frequency. The Larmor frequency is dependent on, for example, the type of the nuclei and on the magnetic flux density of the basic magnetic field.

Since the alignment of the nuclear spins in parallel with the basic magnetic field represents a thermal and energetic state of equilibrium, a parallel alignment of a net magnetization with the basic magnetic field often occurs. The net magnetization, referred to hereinafter as magnetization, may be determined as the effective macroscopic magnetization of the individual magnetic dipole moments of the nuclear spins.

Using a gradient coil unit, additional and spatially varying magnetic fields (e.g., magnetic field gradients) may be emitted. Through a consequently position-dependent Larmor frequency along the spatial dimension of the magnetic field gradients, a spatial encoding may be facilitated inside an examination region. Using a high-frequency antenna unit, high-frequency (HF) pulses, such as excitation pulses or saturation pulses, may be emitted. Insofar as an HF pulse is resonant with the Larmor frequency of the nuclear spins, an excitation (e.g., a deflection) of the nuclear spins may result from a state of equilibrium. The resulting transverse component of the precession of the net magnetization around the direction of the basic magnetic field may lead to induction in the HF antenna unit, with the transverse component of the net magnetization decreasing (e.g., exponentially) with a transverse relaxation time. An MR signal (e.g., a Free-Induction-Decay (FID)) may, for example, be detected using the HF antenna unit. In addition, a longitudinal relaxation of the net magnetization back into the thermal state of equilibrium ensues.

Using the MR signals that have been detected, which are, for example, spatially encoded by the emission of magnetic field gradients, magnetic resonance images (MR images) of the examination subject may be reconstructed.

If a plurality of MR signals are read after emission of a single excitation pulse, then the course over time of a relaxation of the nuclear spins may be determined. The length of time between the emission of the excitation pulse and the readout of an MR signal may be referred to as the echo time (TE).

The emission of a plurality of magnetic field gradients (e.g., along different spatial dimensions) and combined in a sequence by HF pulses is also often known as a pulse sequence or MR sequence. The sequences also often include a chronological sequence of readout windows (e.g., analog-to-digital conversion (ADC)), inside which a readout of MR signals is facilitated.

In many imaging techniques using a magnetic resonance unit, the homogeneity of the basic magnetic field in the examination region is of significant importance. Basic magnetic field inhomogeneities may lead, for example, to distortions or obliterations in MR images.

The basic magnetic field inhomogeneities may arise as a result of a rigid arrangement of components of the magnetic resonance unit and/or through the insertion of an examination subject (e.g., a patient) into the examination region of the magnetic resonance unit and/or through a movement of components of the magnetic resonance unit and/or through the insertion of further objects (e.g., ferromagnetic objects) into the examination region.

It is known from the prior art that basic magnetic field inhomogeneities may be analyzed using a spherical harmonic analysis into three terms of the first order and further terms of higher orders. The spherical harmonic analysis may be seen, for example, as a development of the basic magnetic field according to spherical harmonics. Equation (1) shows, for example, an analysis of the basic magnetic field $B_z$ in spherical harmonic terms.

$$B_z(\rho, \vartheta, \varphi) = A_0^0 + \sum_{l=1}^{\infty} \left(\frac{\rho}{\rho_0}\right)^l \sum_{m=0}^{l} P_l^m(u)(A_l^m \cos(m\varphi) + B_l^m \sin(m\varphi)) \quad (1)$$

The coefficients A and B each refer to clear harmonic terms, which may be adjusted to a measured map of the basic magnetic field. $P_l^m(u)$ denotes Legendre polynomials, where $u=\cos \vartheta$. In a spherical coordinate system, $\rho$ denotes a radius, $\vartheta$ denotes an azimuth angle (with $0 \leq \vartheta \leq 2\pi$), and $\varphi$ denotes a polar angle (with $0 \leq \varphi\ 2\pi$). Terms of the first order in the spherical harmonic analysis are equal here to l=1. Terms of a higher order in the spherical harmonic analysis may be determined for l>1.

The three terms of the first order each correspond to one of three orthogonal directional terms. To compensate for the basic magnetic field inhomogeneities of the first order, an offset current corresponding to the three orthogonal directional terms of the first order in spherical harmonic analysis (e.g., "spherical-harmonics") is fed into the gradient coil unit. A compensation of basic magnetic field inhomogeneities of a higher order often ensues using a separate shim coil apparatus.

Known methods have a number of disadvantages. For example, through the additional powering of the gradient coil unit with the offset current, "parasitic" terms of a higher order may occur as a basic magnetic field inhomogeneity. The powering of a coil element may provide an energizing of the coil element with an electric current.

Through the, for example, simultaneous use of the gradient coil unit for emitting magnetic field gradients and for correcting basic magnetic field inhomogeneities of the first order, the power capacity of individual applications is limited.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an apparatus to compensate for basic magnetic field inhomogeneities of the first order in an examination region of a magnetic resonance unit is provided.

According to this, provision is made for a magnetic resonance unit to include a shim coil apparatus and a gradient coil apparatus. The shim coil apparatus is configured to compensate for basic magnetic field inhomogeneities of the first order in an examination region of the magnetic resonance unit. The shim coil apparatus includes at least one shim coil element. In addition, the gradient coil apparatus is arranged in a gradient coil layer. In addition to the gradient coil apparatus, at least one part of the at least one shim coil element is arranged in the gradient coil layer.

Using a spherical harmonic analysis of the basic magnetic field inhomogeneities, at least three terms of the first order, for example, and further terms of higher orders may be derived. The three terms of the first order, for example, correspond in each case to one of three spatial directions orthogonal to one another.

As a result of the shim coil apparatus being configured to compensate for the basic magnetic field inhomogeneities of the first order in the examination region of the magnetic resonance unit, additional powering of the gradient coil apparatus with an offset current may, for example, be dispensed with. As a result, the complete power capacity of the gradient coil apparatus is maintained for the emission of the magnetic field gradients.

The occurrence of "parasitic" basic magnetic field inhomogeneities of a higher order may be prevented through compensation of basic magnetic field inhomogeneities of the first order with a shim coil apparatus embodied for this purpose. This is facilitated, for example, by the use of the shim coil apparatus, which is particularly suitable, for example, for compensating for basic magnetic field inhomogeneities of the first order.

For example, with an arrangement of the shim coil apparatus on a gradient coil apparatus, which includes a shield unit for shielding magnetic fields, a separate shield on the shim coil apparatus may be dispensed with.

The examination region is configured to record the examination subject entirely or partly. The examination region is limited, for example, by a housing (e.g., a cylindrical housing) of the magnetic resonance unit. For example, the examination region may be configured as a bore.

The at least one shim coil element is, for example, an electrically conductive structure, which is configured such that when an electric current flows through the electrical structure (e.g., when supplying the shim coil element), a magnetic field that homogenizes the basic magnetic field is generated.

The gradient coil apparatus is arranged in a gradient coil layer. The gradient coil layer includes, for example, an inner delimiting surface and an outer delimiting surface that delimit the gradient coil layer in a radial direction. The gradient coil layer has, for example, a thickness that is determined by a radial expanse of the gradient coil apparatus. The inner delimiting surface is usually a shorter distance from the examination region than the outer delimiting surface.

Cylindrical supporting tube- and/or frame systems are often used as a load-bearing component for units of gradient coil apparatus. The gradient coil layer includes, for example, a layer on the cylinder surface (e.g., on the cylinder shell surface) between an inner and an outer radius of an extent of the gradient coil apparatus. The gradient coil apparatus (e.g., the cylindrical gradient coil apparatus) may be arranged around the examination region of the magnetic resonance unit.

Through the at least partial arrangement of the at least one shim coil element in the gradient coil layer in addition to the gradient coil apparatus, an arrangement of the shim coil apparatus that surrounds the examination region of the magnetic resonance unit may be achieved without any additional space being required. The at least one shim coil element of the shim coil apparatus may be arranged inside the gradient coil layer and, for example, be arranged between the inner radius and the outer radius of the gradient coil layer (e.g., cylindrical). As a result of the shim coil apparatus being arranged inside the gradient coil layer, and the gradient coil apparatus often including a supporting component, further supporting components may often be dispensed with in the shim coil apparatus. This is advantageous, for example, for a lower space requirement and a simple design of the shim coil apparatus.

In a further embodiment, the shim coil apparatus and the gradient coil apparatus may be configured to be powered by a common amplifier (e.g., electrical). The powering of the gradient coil apparatus and of the shim coil apparatus may be achieved by a common amplifier. The gradient coil apparatus may include at least one gradient coil element, where the at least one gradient coil element and the at least one shim coil element (e.g., coupled) may be powered by a common amplifier.

The at least one gradient coil element is, for example, an electrically conductive structure, which is configured such that, when an electric current flows through the electrically conductive structure (e.g., when powering the gradient coil element), a magnetic field gradient (e.g., a spatially linear magnetic field) is generated.

To emit a magnetic field gradient and to compensate for basic magnetic field inhomogeneities of the first order, a powering (e.g., simultaneous powering) of the at least one gradient coil element and of the at least one shim coil element may ensue with different current strengths in each case. This may be facilitated, for example, by a variable electrical resistance and/or an appropriate electrical and/or electromagnetic coupling of the respective coil elements. For example, an inductive coupling of the gradient coil apparatus and of the shim coil apparatus may be taken into account when adjusting the power feed by the common amplifier.

Through an appropriate design of the shim coil apparatus (e.g., of an arrangement of the at least one shim coil element that is wound in the opposite direction with respect to at least one gradient coil element of the gradient coil apparatus), a variable magnetic field shielding may be achieved when powering the shim coil apparatus and the gradient coil apparatus.

In a further embodiment, the shim coil apparatus and the gradient coil apparatus may be configured to each be powered by a separate amplifier. The respective devices each make different demands on the respective amplifier for the power supply. While the shim coil apparatus may be powered by a direct current amplifier, the gradient coil apparatus requires a fast-varying supply from the amplifier. Through having a separate power supply for the shim coil apparatus and the gradient coil apparatus, each by a separate amplifier, an optimum power supply may ensue in each case, with the power capacities available in each case being maintained. With the simultaneous powering of the shim coil apparatus and of the gradient coil apparatus, which are both arranged in the gradient coil layer, an inductive coupling, for example, may be taken into account. In addition, through an appropriate spatial arrangement of the at least one shim coil element (e.g., rotated geometrically by 45 degrees) with respect to a spatial arrangement of the at least one gradient coil element of the gradient coil apparatus, an inductive coupling may be reduced.

In a further embodiment, the at least one shim coil element may be configured as a fingerprint coil (e.g., with a fingerprint design). As a result, an optimized design of the at least one shim coil element (e.g., adjusted to constructional specifications for the gradient coil layer and/or for the magnetic resonance unit and/or for further components) may be facilitated. For example, the at least one shim coil element may be configured such that at least one opening, for example, for the arrangement of a window and/or to allow the passage of a surgical instrument is facilitated inside the shim coil apparatus. By embodying the at least one shim coil element as a fingerprint coil, a particularly optimized arrangement of the shim coil apparatus inside the gradient coil layer may be facilitated.

Through an optimized design of the at least one coil element as a fingerprint coil and knowing the arrangement of at least one gradient coil element in the gradient coil apparatus, a particularly low amount of inductive coupling may be achieved.

In a further embodiment, the shim coil apparatus may include a plurality of identical shim coil elements. The shim coil apparatus, for example, may be configured as a matrix coil. As a result of the shim coil apparatus including a plurality of identical shim coil elements, a particularly cost-effective production and/or maintenance may be facilitated.

In a further embodiment, the shim coil apparatus may include a plurality of shim coil elements. The plurality of shim coil elements are each configured to be powered via one channel of the amplifier that powers the shim coil apparatus. As a result, a targeted powering of the plurality of shim coil elements that is adjusted to the examination region may be facilitated. As a result, it is possible, for example, for a particularly quick and simple adjustment of the compensation of the basic magnetic field inhomogeneities of the first order to ensue in the event of the position of the examination subject being changed and/or of a movement of an object (e.g., a ferromagnetic object) inside the examination region. For example, when powering a plurality of shim coil elements via one channel in each case of the amplifier that powers the shim coil apparatus, an inductive coupling of the plurality of shim coil elements may be taken into account.

In a further embodiment, the plurality of shim coil elements may be arranged in an n-fold rotationally symmetrical manner around a longitudinal axis of the examination region of the magnetic resonance unit, where n is a natural number greater than 1. As a result, a particularly cost-effective design (e.g., modular design) of the shim coil apparatus may be facilitated. Through an n-fold rotationally symmetrical design of the shim coil apparatus, a particularly simple and quick compensation for basic magnetic field inhomogeneities of the first order, which occur, for example, through a rotational movement of an object (e.g., a ferromagnetic object) around a longitudinal axis of the examination region may ensue.

The shim coil apparatus may be configured in a modular split design along a circumference and/or along a longitudinal direction of the examination region. Through the split and n-fold rotationally symmetrical design, a cost-effective production and/or maintenance may be facilitated.

In a further embodiment, each shim coil element of the plurality of shim coil elements may be configured to compensate in each case for one term in a spherical harmonic analysis of the basic magnetic field inhomogeneities of the first order. As a result, a targeted powering of the individual shim coil elements may be provided by the amplifier that powers the shim coil apparatus. An inductive coupling of individual shim coil elements with one another and/or between the plurality of shim coil elements and gradient coil elements in the gradient coil apparatus may be reduced more effectively since the individual shim coil elements may be powered separately from one another (e.g., differently). In addition, an allocation of the plurality of shim coil elements to each of the terms in the spherical harmonic analysis of the basic magnetic field inhomogeneities of the first order that have to be compensated for may be taken into account in the geometrical arrangement of the shim coil elements in the gradient coil layer.

In a further embodiment, in each case, a plurality of coactive shim coil elements may be configured to compensate in each case at least in part for a plurality of terms in a spherical harmonic analysis of the basic magnetic field analysis of the first order. This may be advantageous, for example, in a design of the shim coil apparatus as a matrix coil. An appropriate shim profile of the amplifier that powers the shim coil apparatus may be selected to compensate for the basic magnetic field inhomogeneities of the first order (e.g., dynamically).

The shim profile may include, for example, the allocation and/or spatial representation of at least one part of a magnetic field that homogenizes the basic magnetic field to the plurality of shim coil elements. The shim profile may include, for example, the allocation of scaling factors to each shim coil element of the plurality of shim coil elements. The scaling factors may specify a field strength of the magnetic field that homogenizes the basic magnetic field based on the basic magnetic field strength.

In an n-fold rotationally symmetrical arrangement of the plurality of coactive shim coil elements, a particularly intuitive and quick dynamic adjustment of a shim profile to a change in the position of an object (e.g., a ferromagnetic object) around a longitudinal axis of an examination region may be facilitated.

By having a greater number of shim coil elements, a more precise (e.g., customized) arrangement of the shim coil elements inside the gradient coil layer may ensue. Further components and/or parts of the magnetic resonance unit may be taken into account in the arrangement of the plurality of shim coil elements.

In a further embodiment, the shim coil apparatus may include a plurality of feed points that are each electrically connected to one shim coil element of the plurality of shim coil elements. The plurality of feed points may be arranged along a circumference inside the gradient coil layer. In addition, the magnetic resonance unit may include a plurality of contact surfaces, which are each electrically connected to one channel of the plurality of channels in the amplifier. The plurality of contact surfaces may be arranged along the circumference inside the gradient coil layer, with each feed point being able to make contact with one contact surface in each case. The shim coil apparatus may be configured to compensate for basic magnetic field inhomogeneities of the first order that occur due to a rotational movement of an object (e.g., a ferromagnetic object) that is rigidly connected to the array of contact surfaces relative to the shim coil apparatus around a longitudinal axis of an examination region of the magnetic resonance unit.

It is known from the prior art that for determining a shim profile and/or feed profile to compensate for basic magnetic field inhomogeneities, a magnetic field map is often recorded. This magnetic field map includes a spatial representation of the basic magnetic field strength and/or of the basic magnetic field inhomogeneities.

The feed profile may include an allocation of field strengths for an electric feed and/or of scaling factors for an electric feed with a basic current power for each shim coil element of the plurality of shim coil elements that, for example, remains constant over time.

In the embodiment provided, a first shim profile and/or feed profile for the amplifier that powers the shim coil apparatus may be determined and/or emitted for a static arrangement of the object and of the magnetic resonance unit to compensate for the basic magnetic field inhomogeneities of the first order.

With the rotational movement of the object that is rigidly connected to the array of contact surfaces relative to the shim coil apparatus around the longitudinal axis of the examination region, a change in the contacting of the feed points occurs, for example, along the circumference of the shim coil apparatus. Since each of the feed points is electrically connected in each case to one shim coil element of the plurality of shim coil elements, a change in the allocation may occur between, for example, the plurality of channels of the amplifier and the shim coil elements powered by each of the channels. Through the mechanically changed contacting between the plurality of feed points and the plurality of contact surfaces along a circumference, a particularly direct and simple adjustment of the shim profile and/or feed profile to compensate for the basic magnetic field inhomogeneities of the first order may be facilitated.

For example, through the mechanical adjustment of the shim profile and/or feed profile, the recording of further magnetic field maps may be dispensed with. As a result, in a dynamic adjustment of the shim profile and/or feed profile to the basic magnetic field inhomogeneities of the first order that have been changed by the rotational movement of the object, the duration of the measurement may be clearly reduced.

In addition, with a change in the contacting between the feed points and contact surfaces, a rotation of the first shim profile and/or feed profile ensues around the longitudinal axis of the examination region. Depending on the number of feed points and contact surfaces that are arranged (e.g., regularly) along the circumference inside the gradient coil layer, a specific number of rotational angles may be compensated for on a purely mechanical basis. For example, an embodiment of the shim coil apparatus with a plurality of shim coil elements, which are arranged n-fold rotation-symmetrically around the longitudinal axis of the examination region, may be advantageous. A plurality of shim coil elements from the set of all the shim coil elements of the shim coil apparatus may also be powered jointly, in each case from one channel of the amplifier.

For example, with a rotational movement of the object at rotation angles that occur between the rotation angles of the n-fold rotational symmetry of the shim coil apparatus, a compensation for the changed (e.g., rotated around the longitudinal axis) basic magnetic field inhomogeneities of the first order may ensue via an electronic adjustment of the first shim profile and/or feed profile.

In a further embodiment, the shim coil apparatus may include at least one motion sensor that is embodied to detect a movement of an object (e.g., a ferromagnetic object) relative to the shim coil apparatus. The shim coil apparatus may be configured to carry out a compensation of the basic magnetic field inhomogeneities using the movement detected by the at least one motion sensor.

The motion sensor may include, for example, an optical and/or electromagnetic and/or mechanical sensor. The object, the movement of which is detected by the motion sensor, may include, for example, a component of the magnetic resonance unit and/or an object arranged on an examination subject and/or a surgical instrument and/or include a mobile X-ray device.

When the motion sensor detects a movement of the object relative to the shim coil apparatus, the motion sensor may generate a signal that may be used to compensate for the basic magnetic field inhomogeneities. For a static arrangement of the object and of the magnetic resonance unit, a first shim profile and/or feed profile may be determined and/or issued for the amplifier that powers the shim coil apparatus to compensate for the basic magnetic field inhomogeneities of the first order. Using the signal generated by the motion sensor, a particularly quick and simple adjustment of the shim profile and/or feed profile may then ensue to compensate for the basic magnetic field inhomogeneities of the first order that have been changed by the movement of the object. Through the use of the motion sensor to determine a movement of the object relative to the shim coil apparatus, an adjustment of the shim profile and/or feed profile may be facilitated without an additional recording of a magnetic field map. As a result, a clearly shorter duration of the measurement may be achieved.

Hereafter, methods for compensating for magnetic field inhomogeneities of the first order in an examination region of the magnetic resonance unit are disclosed. The advantages of these methods essentially correspond to the advantages of the magnetic resonance units described by way of example in the aforementioned to compensate for basic magnetic field inhomogeneities of the first order in an examination region of the magnetic resonance unit. Features, advantages, or alternative embodiments described here may likewise be applied to the other subject matter, and vice versa.

In a method according to the present embodiments, the magnetic resonance unit includes a shim coil apparatus and a gradient coil apparatus. The shim coil apparatus includes at least one shim coil element. The gradient coil apparatus is arranged in a gradient coil layer. The at least one shim coil element is arranged in the gradient coil layer in addition to the gradient coil apparatus. The basic magnetic field inhomogeneities of the first order are compensated for through a feed to the shim coil apparatus.

In a further embodiment of a method, the shim coil apparatus and the gradient coil apparatus may be powered by a common amplifier.

The shim coil apparatus and the gradient coil apparatus may each be powered by a separate amplifier.

In a further embodiment, the shim coil apparatus may include a plurality of shim coil elements. The plurality of shim coil elements are powered in each case by one channel of the amplifier that powers the shim coil apparatus.

In a further embodiment, using each shim coil element of the plurality of shim coil elements, in each case, one term in the spherical harmonic analysis of the basic magnetic field inhomogeneities of the first order may be compensated for.

In a further embodiment, using, in each case, a plurality of coactive coil elements, at least partially, a plurality of terms in a spherical harmonic analysis of the basic magnetic field inhomogeneities of the first order may be compensated for.

In a further embodiment, the shim coil apparatus includes a plurality of feed points that are each electrically connected to one shim coil element of a plurality of shim coil elements. The plurality of feed points may be arranged along a circumference inside the gradient coil layer. The magnetic resonance unit may include a plurality of contact surfaces that are each electrically connected to one channel of a plurality of channels in the amplifier. The plurality of contact surfaces may be arranged along the circumference inside the gradient coil layer. In addition, each power point may make electrical contact with one contact surface in each case. The basic magnetic field inhomogeneities of the first order that occur through a rotational movement of an object (e.g., a ferromagnetic object) that is rigidly connected to the array of contact surfaces relative to the shim coil apparatus around a longitudinal axis of the examination region of the magnetic resonance unit may be compensated for by the shim coil apparatus.

In a further embodiment, the shim coil apparatus may include at least one motion sensor. Using the motion sensor, a movement of an object (e.g., a ferromagnetic object) relative to the shim coil apparatus may be detected. Using the shim coil apparatus and the movement detected by the at least one motion sensor, compensation for the basic magnetic field inhomogeneities may be effected.

The magnetic resonance unit may include a display unit (e.g., a display and/or monitor and/or an LED display) that is configured to display information and/or graphic representations of information from the magnetic resonance unit and/or from further components of the magnetic resonance unit.

A computer program product that includes a program and may be loaded directly into a memory of a programmable computation unit and includes programming means, such as libraries and auxiliary functions, in order to carry out a method for compensating for basic magnetic field inhomogeneities of the first order in an examination region of a magnetic resonance unit when the computer program product is run is provided. The computer program product may include software with a source code that still has to be compiled and bound or merely interpreted or an executable software code that only has to be loaded into the processing unit for execution. Using the computer program product, the method for compensating for basic magnetic field inhomogeneities of the first order in an examination region of a magnetic resonance unit may be effected quickly, in an identically repeatable manner, and robustly. The computer program product is configured such that the computer program produce may carry out the process acts according to the present embodiments using the processing unit. The processing unit is, in each case, to have the prerequisites, such as, for example, an appropriate main memory, an appropriate graphics card, or an appropriate logic unit, such that the respective process steps may be carried out efficiently.

The computer program product is, for example, stored on a computer-readable medium or deposited on a network or server from which the computer program produce may be loaded into the processor of a processing unit, which may be directly connected to the processing unit or embodied as part of the processing unit.

Control information for the computer program product may be stored on an electronically readable data carrier. The control information on the electronically readable data carrier may be configured such that, when the data carrier is used in a processing unit, the control information carries out a method according to the present embodiments. Examples of electronically readable data carriers are a DVD, a magnetic tape, or a USB stick on which electronically readable control information (e.g., software) is stored. When this control information is read by the data carrier and stored in a processing unit, all the embodiments of the methods that are disclosed in the aforementioned may be carried out. The present embodiments may therefore also take as a point of departure the computer-readable medium and/or the electronically readable data carrier.

BRIEF DESCRIPTION OF THE DRAWINGS

In different figures, same features are denoted by same reference signs. The figures show.

DETAILED DESCRIPTION

Figure 1:
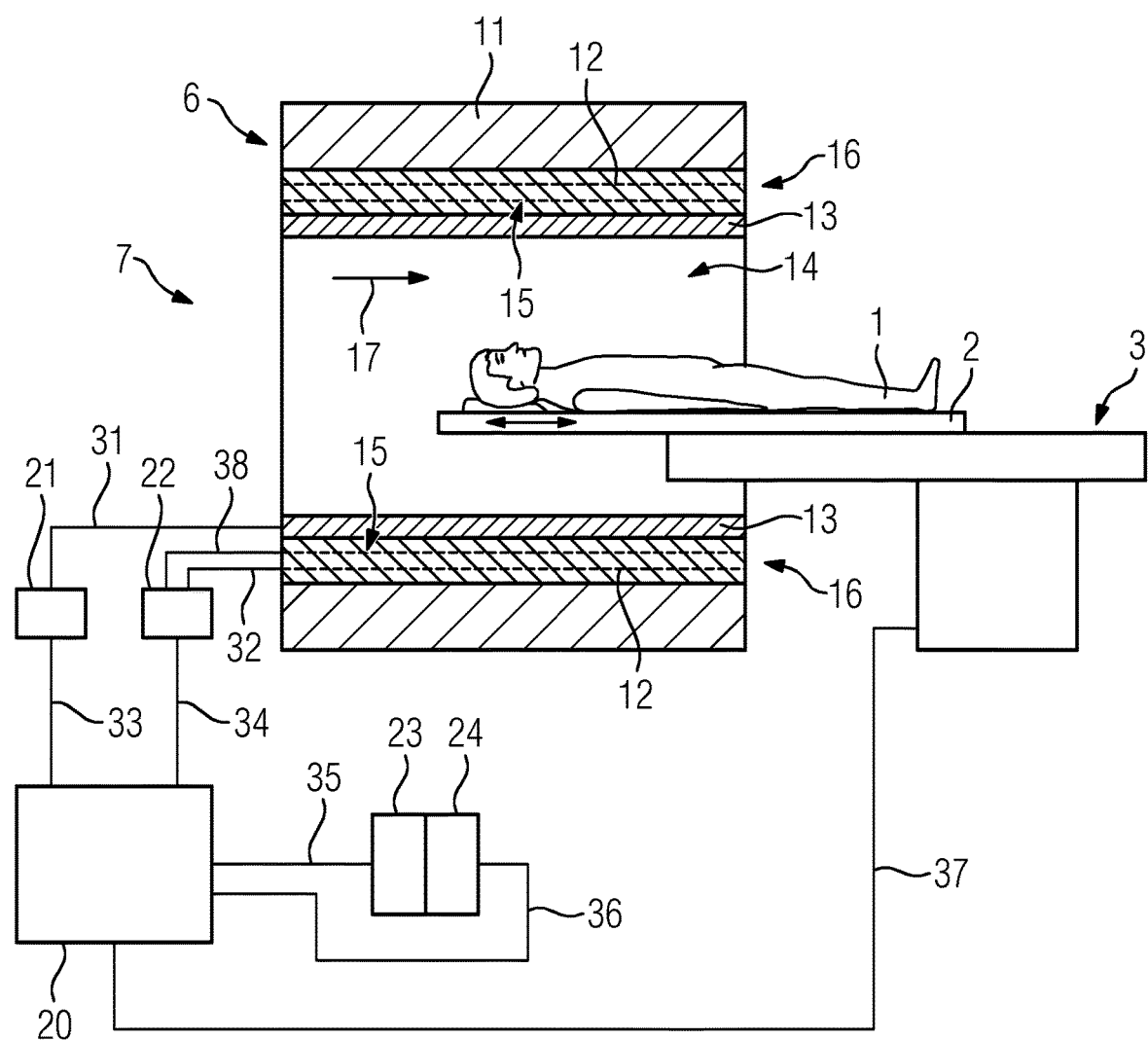
FIG. 1 is a schematic representation of one embodiment of a magnetic resonance unit.

FIG. 1 shows schematically one variant of a magnetic resonance unit 7 for carrying out a proposed method. The magnetic resonance unit 7 includes a magnet unit 6 and an examination region 14. The magnet unit 6 further includes, for example, a superconductive base magnet 11 that is configured to generate a basic magnetic field 17 with a basic magnetic field strength that remains constant over time. For example, the examination region 14 may have a cylindrical shape. The examination region 14 may be surrounded by the magnet unit 6 along a shell surface of the cylinder. The examination region 14 has at least one opening to receive an examination subject 1 and a positioning device 2. The positioning device 2 is movably mounted, such that a positioning of the examination subject 1 may ensue from a position outside the magnetic resonance unit 7 into the examination region 14. The positioning device 2 may be supported by a positioning table 3 and, for example, be moved by a motor and/or automatically. A processing unit 20 (e.g., a processor) may send a signal 37 to the positioning table 3. Conversely, a query about the current positioning of the examination subject 1 may ensue through the processing unit 20 retrieving a signal 37 from the positioning table 3.

The magnet unit 6 includes a gradient coil apparatus 12, which is configured to generate magnetic field gradients (e.g., readout gradients) for spatial encoding during imaging. Control of the gradient coil apparatus 12 may ensue using the amplifier 22. The amplifier 22 may supply a variable current 32 to the gradient coil apparatus 12. The gradient coil apparatus 12 is arranged inside a gradient coil layer 16. The magnet unit 6 includes a shim coil apparatus 15, which is configured to compensate for basic magnetic field inhomogeneities of the first order in the examination region 14 of the magnetic resonance unit 7. The shim coil apparatus 15 includes, for example, at least one shim coil element (not shown here). At least one part of the at least one shim coil element is arranged in addition to the gradient coil apparatus 12 in the gradient coil layer 16.

FIG. 1 shows an embodiment of a magnetic resonance unit. The gradient coil apparatus 12 and the shim coil apparatus 15 are configured to be powered by a common amplifier 22 (e.g., by, in each case, a variable and/or constant current 32 and 38).

The magnet unit 6 also includes an HF antenna unit 13 that is configured as a body coil in the proposed exemplary embodiment. The HF antenna unit 13 is fixedly incorporated into the magnet unit 6 and surrounding the examination region 14. The HF antenna unit 13 is configured to deflect a magnetization. The magnetization takes the form of a net magnetization, with a parallel alignment of proton spins occurring in a state of equilibrium in the basic magnetic field 17. For example, the excitation of polarization may ensue through the emission of excitation pulses and/or refocusing pulses. The HF antenna unit 13 may be controlled by an HF processing unit 21 using a signal 31.

The HF antenna unit 13 is further configured to receive MR signals. The HF antenna unit may send a corresponding signal 31 to the HF processing unit 21.

The control of the amplifier 22, the HF processing unit 21, and the base magnet 6 may ensue, for example, via a processing unit 20 (e.g., a processor) of the magnetic resonance unit 7. To this end, the signals 33 and 34 may be used bidirectionally, for example.

The processing unit 20 may be configured to translate a sequence (e.g., for generating MR images) into signals for the respective components of the magnetic resonance unit 7. As a result, the running of a sequence in an MR examination may be facilitated. The processing unit 20 may be configured to process the MR signals received from the HF antenna unit 13 and, for example, generate MR images therefrom.

The magnetic resonance unit 7 includes a display unit 23 that is configured to display parameter values for a sequence and/or MR images. The processing unit 20 may send a signal 35 to the display unit 23. The display unit 23 may be configured as a monitor and/or display. The magnetic resonance unit 7 may include an input unit 24 (e.g., a keyboard and/or a touchscreen and/or an array of buttons) that is configured to send an input from an operator to the processor 20 using a signal 36.

Control of the positioning device 2 may likewise be facilitated via an input from an operator on the input unit 24. The processing unit 20 may send a signal 37 to the positioning table 3, through which an automatic and/or semi-automatic positioning of the examination subject 1 relative to an isocenter of the magnetic resonance unit 7 is facilitated.

Figure 2:
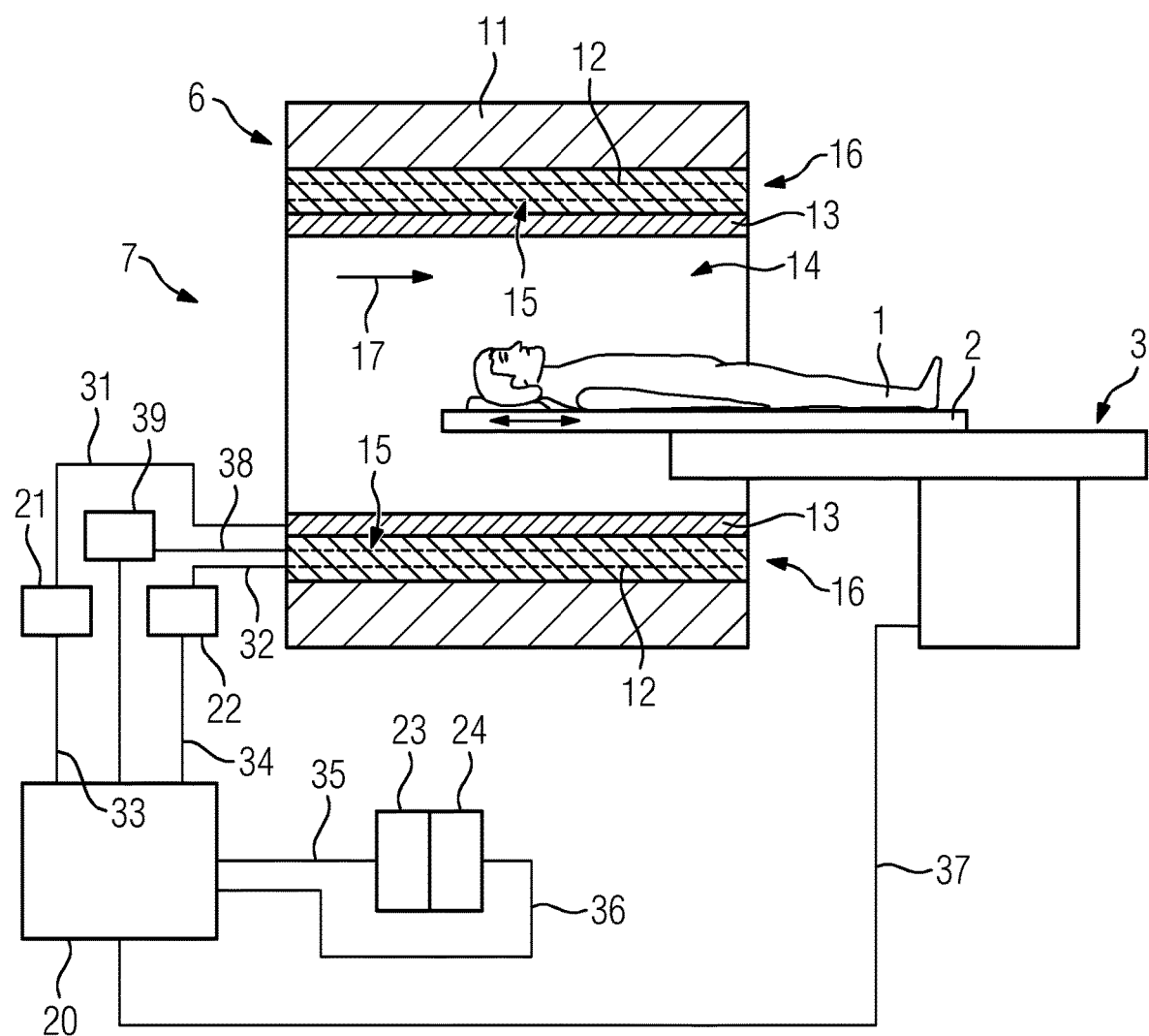
FIG. 2 is a schematic representation of another embodiment of a magnetic resonance unit.

In the embodiment shown in FIG. 2 of a magnetic resonance unit, the shim coil apparatus 15 and the gradient coil apparatus 12 are configured to each be powered by a separate amplifier 22 and 39. The amplifier 39, which powers the shim coil apparatus 15, may, for example, supply a current that remains constant over time 38.

Figure 3:
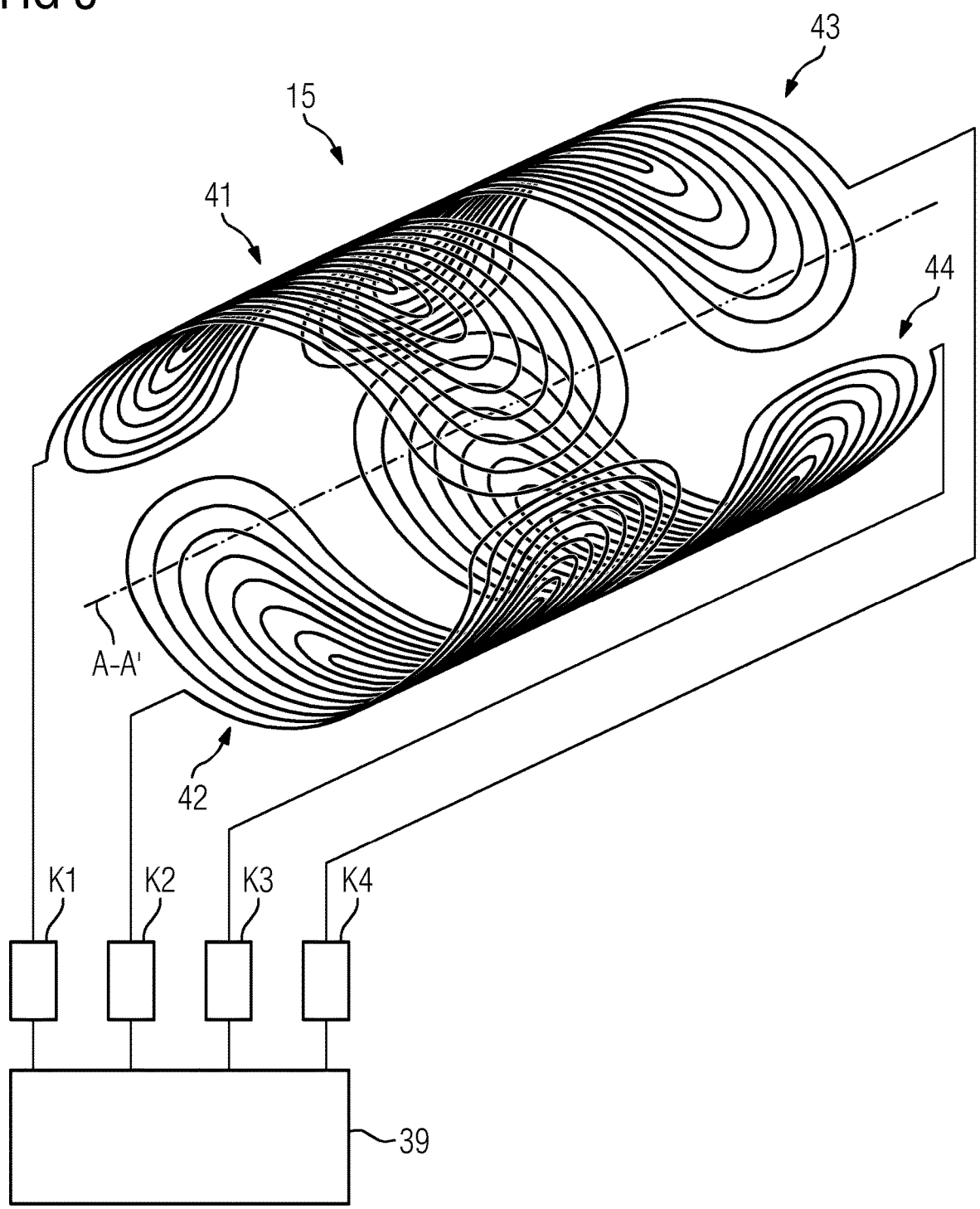
FIG. 3 is a schematic representation of an embodiment of a shim coil apparatus as a fingerprint coil.

FIG. 3 shows a schematic representation of an embodiment of the shim coil apparatus 15 as a fingerprint coil. The shim coil apparatus 15 may include, for example, four shim coil elements 41 to 44 that are each powered via one channel of a plurality of channels K1 to K4 of the amplifier 39. The shim coil elements 41 to 44 may be arranged inside a cylindrical gradient coil layer 16 around a longitudinal axis A-A' of the examination region 14. For example, an overlapping and/or spatially separated arrangement of the plurality of shim coil elements may be advantageous. In FIG. 3, each shim coil element of the four shim coil elements 41 to 44 has a characteristic winding pattern that may be visually described as a fingerprint. As a result, a particularly appropriate and/or customized adjustment of the plurality of shim coil elements 41 to 44 to a, for example, static arrangement of components of the magnetic resonance unit 7 and/or of further objects may ensue.

Figure 4:
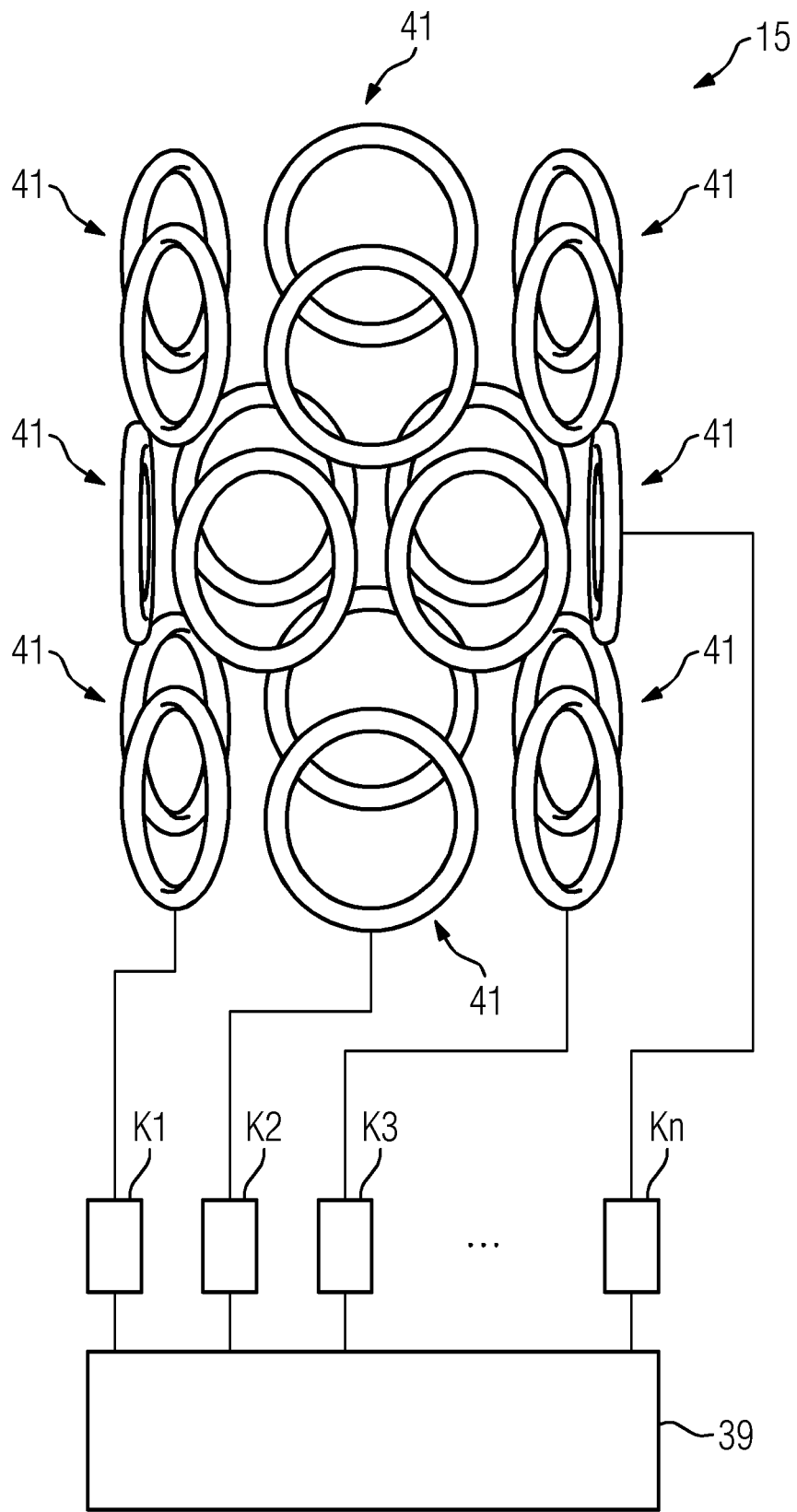
FIG. 4 is a schematic representation of an embodiment of the shim coil apparatus including a plurality of identical shim coil elements.

FIG. 4 shows a schematic view of an embodiment of the shim coil apparatus 15 with a plurality of identical shim coil elements 41. The plurality of, for example, n shim coil elements 41 may be configured to be powered in each case by a channel K1 to Kn of the amplifier 39, where n is a natural number greater than 1. As a result, a particularly precise and dynamic adjustment of a shim profile and/or feed profile of the amplifier 39 may be facilitated, for example, to a spatially extended examination subject 1.

Each shim coil element of the plurality of shim coil elements 41 may be configured to compensate in each case for one term in a spherical harmonic analysis of the basic magnetic field inhomogeneities of the first order. A particularly appropriate geometrical arrangement of the allocated shim coil elements 41 may ensue for each term in the spherical harmonic analysis of the basic magnetic field inhomogeneities of the first order. For example, the geometrical arrangement of the plurality of shim coil elements 41 may ensue as a function of the arrangement of gradient coil elements in the gradient coil apparatus 12. As a result, any inductive coupling may be reduced.

In a further embodiment, in each case, a plurality of coactive shim coil elements 41 may be configured to compensate for in each case at least part of a plurality of terms in a spherical harmonic analysis of the basic magnetic field inhomogeneities of the first order. The amplifier may issue, via the plurality of channels K1 to Kn, to the plurality of shim coil elements 41, a shim profile and/or feed profile that has been adjusted to the spherical harmonic analysis of the basic magnetic field inhomogeneities of the first order.

Figure 5:
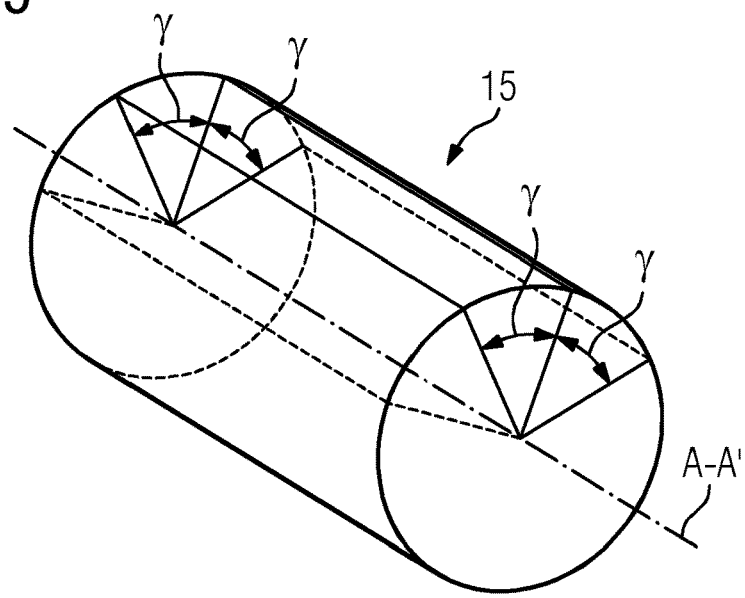
FIG. 5 is a schematic representation of an exemplary n-fold rotationally symmetrical design of the shim coil apparatus.

FIG. 5 is a schematic representation of an n-fold rotationally symmetrical design of the shim coil apparatus 15, where n is a natural number greater than 1. The shim coil apparatus 15 may include a plurality of shim coil elements that are arranged, for example, along spatial sections on a cylinder surface inside the gradient coil layer. The plurality of arrays of shim coil elements along the spatial sections are, for example, n-fold rotationally symmetrical around the longitudinal axis A-A' of the examination region 14. By dividing up the cylinder around the examination region 14 (e.g., into a plurality of cylinder sections, each of equal size with a rotation angle of $\gamma$), the n-fold rotational symmetry of the plurality of shim coil elements 41 may be achieved. As a result, a particularly cost-effective modular design of the shim coil apparatus 15 may be facilitated.

Figure 6:
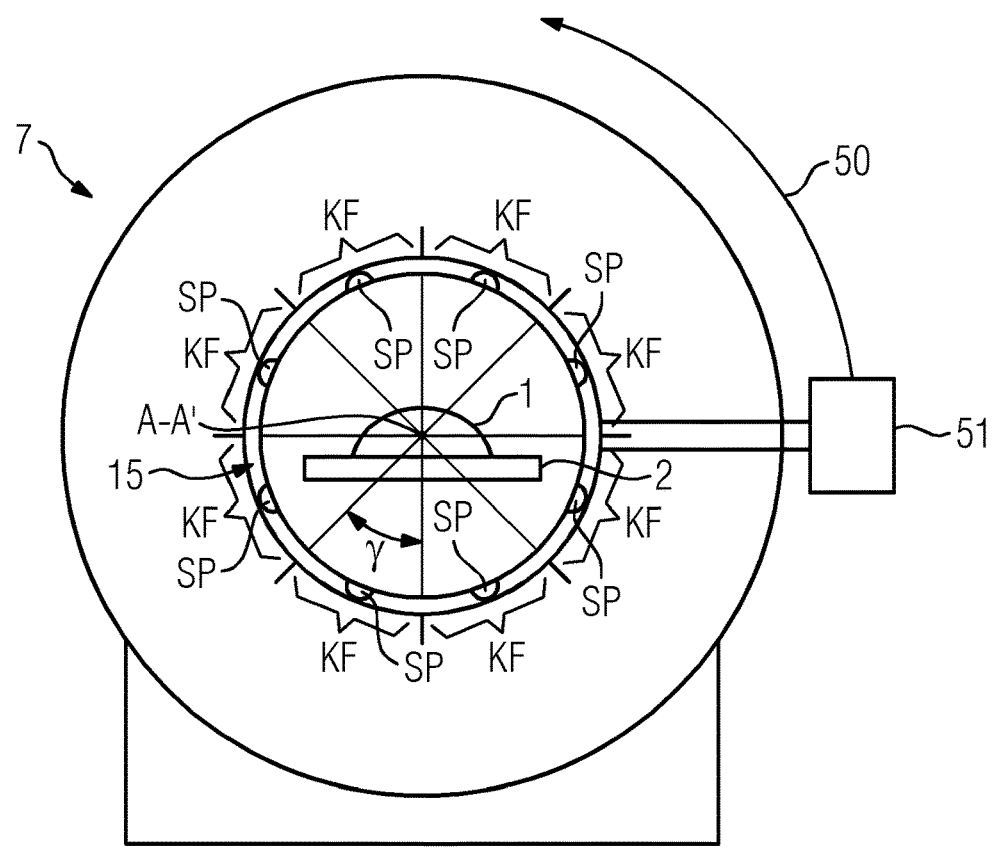
FIG. 6 is a schematic representation of one embodiment of a magnetic resonance unit, which includes an n-fold rotationally symmetrical shim coil apparatus including a plurality of feed points and contact surfaces.

FIG. 6 shows a schematic representation of a magnetic resonance unit 7, which includes an n-fold rotationally symmetrically designed shim coil apparatus 15 with a plurality of feed points SP and contact surfaces KF. In the embodiment, the shim coil apparatus 15 includes a plurality of shim coil elements (not shown here), with each of the plurality of feed points SP being electrically connected to one respective shim coil element of the plurality of shim coil elements. In one embodiment, the plurality of feed points SP along a circumference (e.g., a cylinder around the longitudinal axis A-A' of the examination region 14) are arranged inside the gradient coil layer 16. In addition, the magnetic resonance unit 7 may include a plurality of contact surfaces KF that are each electrically connected to one channel of a plurality of channels of the amplifier 39.

In the exemplary embodiment shown, a 6-fold rotationally symmetrical arrangement of shim coil elements of the shim coil apparatus 15 is illustrated. Each feed point of the plurality of feed points SP may be allocated in each case to a spatial section of the gradient coil layer 16. In the present exemplary embodiment, each feed point SP is arranged on a respective section of a cylinder surface of a rotation angle γ (e.g., centrally). Each feed point SP may make electrical contact in each case with a contact surface KF. So that a clear allocation and contacting between the plurality of contact surfaces KF and feed points SP may be provided, it is advantageous for the contact surfaces KF to be arranged along a circumference, which, for example, is subdivided into a plurality of spatial sections using the angle of rotation γ.

The shim coil apparatus 15 may be configured to compensate for basic magnetic field inhomogeneities of the first order, which occur due to a rotational movement 50 of an object 51 (e.g., a ferromagnetic object) relative to the shim coil apparatus 15, around a longitudinal axis A-A' of the examination region 14 of the magnetic resonance unit 7. With a rotational movement 50 of the object 51, a change in the electrical contacting and allocation may occur between the plurality of contact surfaces KF and feed points SP. As a result, a first shim profile and/or feed profile detected for a static arrangement of the object 51 may be mechanically adjusted by the mechanical rotation of the array of contact surfaces KF, which is rigidly connected to the object 51. The first shim profile and/or feed profile may be determined, for example, by recording a magnetic field map for determining the basic magnetic field inhomogeneities of the first order in the static arrangement.

The accuracy of the mechanical adjustment is dependent on the angle of rotation of the rotational movement 50 and on the number of contact surfaces KF and feed points SP along the circumference inside the gradient coil layer 16. As a result, the recording of a magnetic field map to determine the basic magnetic field inhomogeneities of the first order that have been changed by the rotational movement 50 of the object 51 may be dispensed with. For example, in intermediate regions of the rotational movement 50 that are located inside an angle of rotation γ, the compensation for the change in the basic magnetic field inhomogeneities of the first order may ensue through a slight adjustment of the shim profile and/or the feed profile using the amplifier 39.

Figure 7:
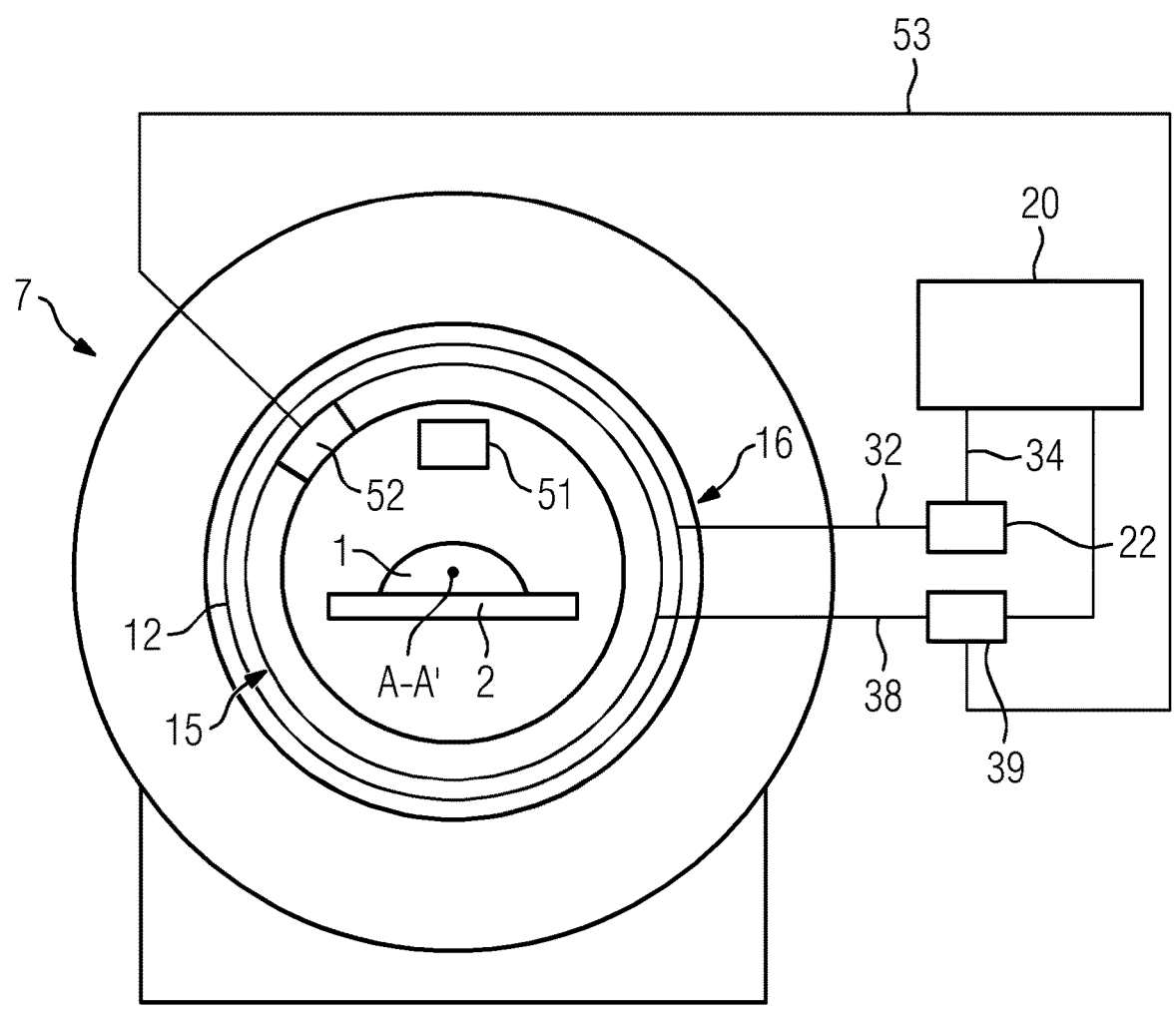
FIG. 7 is a schematic representation of one embodiment of a magnetic resonance unit, which includes a shim coil apparatus with a motion sensor.

FIG. 7 shows a schematic representation of one embodiment of a magnetic resonance unit that includes a shim coil apparatus 15 with a motion sensor 52. The motion sensor 52 may be configured to detect a movement (e.g., a translational and/or rotational movement) of an object 51 relative to the shim coil apparatus 15. When detecting a movement of the object 51 relative to the shim coil apparatus 15, the motion sensor 52 may transmit a signal 53 to the amplifier 39. Using the movement detected by the motion sensor 52, compensation for the basic magnetic field inhomogeneities of the first order may be effected. The amplifier 39 may, for example, carry out an adjustment of the first shim profile and/or feed profile using the signal 53 from the motion sensor 52. By using the signal 53 from the motion sensor 52, the recording of a magnetic field map to determine the basic magnetic field inhomogeneity of the first order that has been changed by the movement of the object 51 may be dispensed with. As a result, in an examination, the duration of the measurement may be clearly reduced.

In further variants, the shim coil apparatus may include a plurality of motion sensors, where the arrangement of the motion sensors inside the gradient coil layer 16 and/or outside the magnetic resonance unit, for example, may be advantageous. For example, a movement of an object 51 may be detected by an optical camera system and used to adjust a first shim profile and/or feed profile. The motion sensor 52 may be arranged on the object 51 in order to detect a movement of the object 51 relative to the shim coil apparatus 15. The at least one motion sensor 52 may include one or a plurality of, for example, optical and/or mechanical and/or electromagnetic sensors.

The schematic representations included in the figures described do not constitute any kind of scale or size relationship.

The methods described in detail in the aforementioned and the devices shown are merely exemplary embodiments that may be modified in many ways by a person skilled in the art without departing from the scope of the invention. The use of the indefinite article "a" or "an" does not preclude the relevant features from being present in plurality. The term "unit" does not preclude the relevant components from consisting of a plurality of coactive components that may optionally also be spatially distributed.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance unit comprising:
   a shim coil apparatus; and
   a gradient coil apparatus,
   wherein the shim coil apparatus and the gradient coil apparatus are configured to be powered by one common amplifier,
   wherein the shim coil apparatus is configured to compensate for basic magnetic field inhomogeneities of the first order in an examination region of the magnetic resonance unit,
   wherein the shim coil apparatus includes at least one shim coil element,
   wherein the gradient coil apparatus is arranged in a gradient coil layer, and wherein at least one part of the at least one shim coil element is arranged in the gradient coil layer in addition to the gradient coil apparatus.

2. The magnetic resonance unit of claim 1, wherein the at least one shim coil element is configured as a fingerprint coil.

3. The magnetic resonance unit of claim 1, wherein the shim coil apparatus includes a plurality of identical shim coil elements.

4. The magnetic resonance unit of claim 1, wherein the at least one shim coil element comprises a plurality of shim coil elements, and
wherein the plurality of shim coil elements are configured to be powered in each case via one channel of the one common amplifier that powers the shim coil apparatus.

5. The magnetic resonance unit of claim 4, wherein the plurality of shim coil elements are arranged n-fold rotationally symmetrically around a longitudinal axis of the examination region of the magnetic resonance unit, and
wherein n is a natural number greater than 1.

6. The magnetic resonance unit of claim 4, wherein each shim coil element of the plurality of shim coil elements is configured to compensate in each case for one term in a spherical harmonic analysis of the basic magnetic field inhomogeneities of the first order.

7. The magnetic resonance unit of claim 4, wherein in each case a plurality of coactive shim coil elements are configured to at least partly compensate for a plurality of terms in a spherical harmonic analysis of the basic magnetic field inhomogeneities of the first order.

8. The magnetic resonance unit of claim 4, wherein the shim coil apparatus includes a plurality of feed points, each feed point of the plurality of feed points being electrically connected to one shim coil element of the plurality of shim coil elements,
wherein the plurality of feed points are arranged along a circumference inside the gradient coil layer,
wherein the magnetic resonance unit further includes a plurality of contact surfaces that are each electrically connected to one respective channel of the channels of the one common amplifier,
wherein the plurality of contact surfaces are arranged along the circumference inside the gradient coil layer,
wherein each feed point of the plurality of feed points makes electrical contact with one respective contact surface of the plurality of contact surfaces, and
wherein the shim coil apparatus is configured to compensate for basic magnetic field inhomogeneities of the first order, which occur due to a rotational movement of an object that is rigidly connected to an array of contact surfaces of the plurality of contact surfaces, relative to the shim coil apparatus, around a longitudinal axis of the examination region of the magnetic resonance unit.

9. The magnetic resonance unit of claim 1, wherein the shim coil apparatus includes at least one motion sensor configured to detect a movement of an object relative to the shim coil apparatus, and
wherein the shim coil apparatus is configured to carry out a compensation for the basic magnetic field inhomogeneities of the first order using the movement detected by the at least one motion sensor.

10. A method for compensating for magnetic field inhomogeneities of a first order in an examination region of a magnetic resonance unit, wherein the magnetic resonance unit includes a shim coil apparatus and a gradient coil apparatus, wherein the shim coil apparatus and the gradient coil apparatus are powered by a common amplifier, wherein the shim coil apparatus includes at least one shim coil element, the method comprising:
arranging the gradient coil apparatus in a gradient coil layer;
arranging the at least one shim coil element in the gradient coil layer in addition to the gradient coil apparatus; and
energizing the shim coil apparatus, such that the basic magnetic field inhomogeneities of the first order are compensated for.

11. The method of claim 10, wherein the shim coil apparatus includes a plurality of shim coil elements, and
wherein the plurality of shim coil elements are powered in each case by one channel of the common amplifier that powers the shim coil apparatus.

12. The method of claim 11, wherein, using each shim coil element of the plurality of shim coil elements, one respective term in a spherical harmonic analysis of the basic magnetic field inhomogeneities of the first order is compensated for.

13. The method of claim 11, wherein using, in each case, a plurality of coactive shim coil elements, at least some terms of a plurality of terms in a spherical harmonic analysis of the basic magnetic field inhomogeneities of the first order are compensated for.

14. The method of claim 11, wherein the shim coil apparatus includes a plurality of feed points that are each electrically connected to one respective shim coil element of the plurality of shim coil elements,
wherein the plurality of feed points are arranged along a circumference inside the gradient coil layer,
wherein the magnetic resonance unit includes a plurality of contact surfaces that are electrically connected in each case to one channel of the plurality of channels in the common amplifier,
wherein the plurality of contact surfaces are arranged along the circumference inside the gradient coil layer,
wherein each feed point of the plurality of feed points makes electrical contact in each case with one contact surface,
wherein the basic magnetic field inhomogeneities of the first order, which occur by a rotational movement of an object that is rigidly connected to the plurality of contact surfaces, relative to the shim coil apparatus, around a longitudinal axis of the examination region of the magnetic resonance unit, are compensated for by the shim coil apparatus.

15. The method of claim 10, wherein the shim coil apparatus includes at least one motion sensor,
wherein the method further comprises detecting, using the motion sensor, a movement of an object relative to the shim coil apparatus, and
wherein, using the shim coil apparatus and of the movement detected by the at least one motion sensor, compensation of the basic magnetic field inhomogeneities of the first order is effected.

16. In a non-transitory computer-readable storage medium that stores instructions executable by one or more processors to compensate for magnetic field inhomogeneities of a first order in an examination region of a magnetic resonance unit, wherein the magnetic resonance unit includes a shim coil apparatus and a gradient coil apparatus, wherein the shim coil apparatus and the gradient coil apparatus are configured to be powered by one common amplifier, wherein the shim coil apparatus includes at least one shim coil element, wherein the gradient coil apparatus is arranged in a gradient coil layer, and wherein the at least one shim coil element is arranged in the gradient coil layer in addition to the gradient coil apparatus, the instructions comprising:

energizing the shim coil apparatus, such that the basic magnetic field inhomogeneities of the first order are compensated for.

* * * * *